(12) United States Patent
Park et al.

(10) Patent No.: US 9,804,244 B2
(45) Date of Patent: Oct. 31, 2017

(54) APPARATUS AND METHOD FOR MAGNETIC RESONANCE IMAGE PROCESSING

(71) Applicant: Korea University Research and Business Foundation, Seoul (KR)

(72) Inventors: Jaeseok Park, Seoul (KR); Suhyung Park, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 505 days.

(21) Appl. No.: 14/612,759

(22) Filed: Feb. 3, 2015

(65) Prior Publication Data
US 2015/0241534 A1 Aug. 27, 2015

(30) Foreign Application Priority Data

Feb. 24, 2014 (KR) ........................ 10-2014-0021294

(51) Int. Cl.
*G01R 33/561* (2006.01)

(52) U.S. Cl.
CPC .................. *G01R 33/5611* (2013.01)

(58) Field of Classification Search
CPC .................................. G01R 33/5611
See application file for complete search history.

(56) References Cited

U.S. PATENT DOCUMENTS

| 2010/0239143 A1* | 9/2010 | Griswold | G06K 9/6247 382/131 |
| 2011/0116724 A1* | 5/2011 | Bilgin | G01R 33/5608 382/248 |
| 2012/0008843 A1* | 1/2012 | Bilgin | G06T 9/00 382/131 |
| 2013/0114872 A1* | 5/2013 | Chen | G06K 9/2054 382/131 |
| 2014/0056496 A1* | 2/2014 | Kwak | A61B 5/0263 382/131 |

FOREIGN PATENT DOCUMENTS

KR 10-2010-0004321 A 1/2010

OTHER PUBLICATIONS

Park, et. al., "Compressed Sensing MRI Exploiting Complementary Dual Decomposition", Medical Image Analysis, vol. 18, Issue 3, pp. 472-486, Feb. 3, 2014.
Lusting, et al., "Sparse MRI: The Application of Compressed Sensing for Rapid MR Imaging", Magn. Reson. vol. 58, pp. 1182-1196, 2007.

\* cited by examiner

*Primary Examiner* — Rodney Bonnette
(74) *Attorney, Agent, or Firm* — Pearne & Gordon LLP (57) ABSTRACT

A method for processing a magnetic resonance image is provided. The method includes receiving data through a receiving coil; setting a plurality of sparse spaces for unit data of a single image; reconstructing an image by data, for which the sparse spaces have been set; and combining the reconstructed images with each other to provide the combined image.

12 Claims, 6 Drawing Sheets

---
Algorithm 1. FB splitting algorithm with the the LSM model
---
1. Task: Find $f_r$ with the LSM model parameters
2. Initialization:
   Iteration index: $t = 1$; Error tolerance: $\epsilon$
   Scale indices; $s = 2, \ldots N_s$; Orientation indices: $o = $ HL,LH,HH
   Gradient step size: $\mu_{t,\text{LSM}} \in (0, 2/\|Q\|^2)$
   Line search parameters: $0 < \alpha < 0.5$, $0 < \beta < 1.0$
   Threshold level: $\Lambda = [\lambda_{s-1} \; \lambda_s]^T$; Initial solution: $\mathbf{w} = \Psi \mathbf{F}_u^* \mathbf{d}_u$
3. Algorithm:
Repeat until a stopping criterion is satisfied: $\|\mathbf{W}^{t+1} - \mathbf{W}^t\|_2^2 < \epsilon$
Outer loop: orientation index, $o=$HL, LH, and HH
Inner loop: scale index, $s = 2, 3, \ldots, N_s$
   Step 1: Estimate LSM model parameters:
   $$\hat{c}_{k,o} = \left[\left(\mathbf{W}_{k,[s-1\;s]}^H \mathbf{W}_{k,[s-1\;s]} + \zeta \mathbf{I}\right)^{-1} \mathbf{W}_{k,[s-1\;s]}^H \mathbf{w}_{k,s-1}\right]_o$$
   Step 2: Update $\mu_{t,\text{LSM}}$ via backtracking line search:
        while $\mathbf{g}(\mathbf{W} + \mu_{t,\text{LSM}} \Delta \mathbf{W}) > \mathbf{g}(\mathbf{W}) + \alpha \mu_{t,\text{LSM}} \nabla \mathbf{g}(\mathbf{W})^H \Delta \mathbf{W}$
            $\mu_{t,\text{LSM}} = \beta \mu_{t,\text{LSM}}$
   Step 3: Forward gradient decent step: $\mathbf{W}^{t+\frac{1}{2}} = \mathbf{W}^t + \mu_{t,\text{LSM}} \mathbf{Q}^H (\mathbf{U} - \mathbf{Q}\mathbf{W}^t)$
   Step 4: Backward wavelet shrinkage step: $\mathbf{W}^{t+1} = \text{SoftThresh}_\Lambda \left(\mathbf{W}^{t+\frac{1}{2}}\right)$
Output: Reconstructed image, $\mathbf{f} = \Psi^* \mathbf{w}$

FIG. 4

| |
|---|
| Algorithm 2. Alternating reconstruction algorithm for complementary image components |
| 1. Task: Find $\mathbf{f_p}$ and $\mathbf{f_r}$ with the LSM model parameters |
| 2. Initialization:<br>Iteration index: $t = 1$; Error tolerance: $\epsilon$; Noise standard deviation: $\sigma$<br>Scale index; $s = 2, \ldots N_s$; Orientation index: $o = $ HL,LH,HH<br>Gradient step size: $\mu_{t,TV} \in (0,2)$, $\mu_{t,LSM} \in (0, 2/\|\mathbf{Q}\|^2)$<br>Line search parameters: $0 < \alpha < 0.5$, $0 < \beta < 1.0$<br>Threshold level: $\mathbf{\Lambda} = [\lambda_{s-1}\ \lambda_s]^T$; Threshold increment: $\delta$<br>Initial baseline image and its residuals: $\mathbf{f_p} = \mathbf{f}$, $\mathbf{f_r} = 0$ |
| 3. Algorithm:<br>Repeat until a stopping criterion is satisfied: $\|\mathbf{f}^{t+1} - \mathbf{f}^t\|_2^2 < \epsilon$<br>Baseline reconstruction<br>    Step 1: Estimate $\mathbf{d_p}$: $\mathbf{d_p} = \mathbf{d_u} - \mathbf{F_u} \mathbf{f_r}^t$<br>    Step 2: Update $\mu_{t,TV}$ via backtracking line search:<br>    while $h\left(\mathbf{f_p} + \mu_{t,TV}\Delta\mathbf{f_p}, \mathbf{f_r}^t\right) > h\left(\mathbf{f_p}, \mathbf{f_r}^t\right) + \alpha\mu_{t,TV}\nabla h\left(\mathbf{f_p}, \mathbf{f_r}^t\right)^H \Delta\mathbf{f_p}$<br>$$\mu_{t,TV} = \beta\mu_{t,TV}$$<br>    Step 3: Estimate $\mathbf{f_p}$:<br>$$\mathbf{f_p}^{t+1} = \mathbf{f_p}^t - \mu_{t,TV}\left(\mathbf{F_u^H}\left(\mathbf{F_u}\mathbf{f_p} - \mathbf{d_p}\right) + \lambda_{TV}\nabla \|\mathbf{f_p}\|_{TV}\right)$$<br>Residual reconstruction<br>    Step 1: Estimate $\mathbf{d_r}$: $\mathbf{d_r} = \mathbf{d_u} - \mathbf{F_u}\mathbf{f_p}^t$<br>    Step 2: Outer loop: orientation index, $o=$HL, LH, and HH<br>            Inner loop: scale index, $s = 2, 3, \ldots, N_s$<br>            Repeat the steps $1 \sim 4$ in Algorithm 1<br>    Step 3: Estimate $\mathbf{f_r}$: $\mathbf{f_r}^{t+1} = \Psi^*\mathbf{w}$<br>Update the combined image: $\mathbf{f}^{t+1} = \mathbf{f_p}^{t+1} + \mathbf{f_r}^{t+1}$<br>Update the threshold value: $\mathbf{\Lambda}^{t+1} = \mathbf{\Lambda}^t - \delta$<br>Stopping rule: if $\max_{\lambda_i} \lambda < \delta$, stop. Otherwise, $t = t + 1$ |

APPARATUS AND METHOD FOR MAGNETIC RESONANCE IMAGE PROCESSING

CROSS-REFERENCE TO RELATED APPLICATION

This application claims the benefit of Korean Patent Application No. 10-2014-0021294 filed on Feb. 24, 2014, the entire disclosures of which are incorporated herein by reference.

TECHNICAL FIELD

The embodiments described herein pertain generally to an apparatus and a method for processing a magnetic resonance image (MRI).

BACKGROUND

In general, a machine for processing a magnetic resonance image acquires a tomographic image of a specific body part of a patient by using a resonance phenomenon resulting from supply of electromagnetic energy. This machine for processing a magnetic resonance image is being widely used since it does not result in radiation exposure and can relatively easily acquire a tomographic image, compared to imaging machines such as X-ray and CT.

To briefly describe a method for producing a magnetic resonance image, a high frequency RF signal is applied to a target for magnetic resonance imaging a multiple number of times so as to excitate spin of atomic nucleuses within the target. Through application of a pulse train to the magnetic resonance machine, the magnetic resonance image processing machine generates various signals such as a free induction decay (FID) signal and spin echo, and selectively acquires the signals to produce a magnetic resonance image.

Although the magnetic resonance image processing machine has had a limit in that it requires long imaging time, compared to other imaging equipment, a compressed sensing technique has been introduced as a method for reducing the imaging time. The compressed sensing technique demonstrated that when an original signal has sparsity, the original signal can be reconstructed, even though a sample frequency is lower than the Nyquist sampling frequency. In this case, in order to reconstruct the original signal through the compressed sensing technique, it is necessary to transform the original signal to a domain where the sparsity of the original signal is maximized, and the original signal is reconstructed through a method that repeatedly estimates the original signal to maximize the sparsity of the original signal in the transform domain.

To more specifically describe the compressed sensing technique, since MRI collects an image signal in a k-space, the compressed sensing is also accomplished in the k-space. With respect to a method for scanning the k-space, there is rectilinear or spiral scanning or others. In order to reconstruct an image through the compressed sensing technique, the following three (3) requirements should be met: first, an original image should have sparsity in a specific transform domain; second, an aliasing artifact should be incoherent when a sampling frequency is lower than the Nyquist sampling frequency in the k-space; and third, a repeated image reconstruction method that maximizes the sparsity of the original image signal and consistency between a measured image signal and an estimated image signal is necessary.

This conventional compressed sensing imaging method implements variable density random under sampling that acquires data with high density in the center of the k-space, i.e., a low frequency domain, and data with low density in the periphery of the k-space, i.e., a high frequency domain. Through this sampling method, an inconsistent aliasing signal appearing in an image can be removed together with noise in a sparse space.

Meanwhile, in this regard, a prior article (Lusting et al., Sparse MRI: The application of compressed sensing for rapid MR imaging, Magn. Reson. Med., vol. 58, pp. 1182-1195, 2007) describes a compressed sensing technique that implements signal restoration by transforming a whole image to one sparse space.

SUMMARY

In view of the foregoing, example embodiments provide an apparatus and a method for processing a magnetic resonance image based on a compressed sensing technique, which is capable of restoring a high resolution image having a complicated structural characteristic by applying a sparse space optimized for a characteristic of an image to separate and restore the image.

In one example embodiment, a method for processing a magnetic resonance image is provided. The method may includes receiving data through a receiving coil; setting a plurality of sparse spaces for unit data of a single image; reconstructing an image by data, for which the sparse spaces have been set; and combining the reconstructed images with each other to provide the combined image.

In another example embodiment, an apparatus for processing a magnetic resonance image is provided. The apparatus may includes a magnetic resonance machine that comprises a main magnet, a gradient coil and an RF coil, and is formed to surround a target to be imaged; a signal transmitting and receiving unit that transmits an electric signal to the magnetic resonance machine, and receives a magnetic resonance signal from the magnetic resonance machine; and a signal processing unit that produces a magnetic resonance image based on the magnetic resonance signal received from the signal transmitting and receiving unit, wherein the signal processing unit sets a plurality of sparse spaces for unit data of a single image, reconstructs an image by the data, for which the sparse spaces have been set, and then, combines the reconstructed images to provide a magnetic resonance image.

In accordance with the example embodiments, different sparse spaces are set depending on characteristics of images, and compressed sensing algorithms for the spaces are independently implemented, so that even when data identical to those in the conventional compressed sensing technique are acquired, the resolution can be further improved.

As a result, since identical resolution can be provided even when less data than the conventional compressed sensing technique are acquired, time for acquiring a magnetic resonance image can be reduced.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Hereinafter, example embodiments will be described in detail with reference to the accompanying drawings so that inventive concept may be readily implemented by those skilled in the art. However, it is to be noted that the present disclosure is not limited to the example embodiments but can be realized in various other ways. In the drawings, certain parts not directly relevant to the description are omitted to enhance the clarity of the drawings, and like reference numerals denote like parts throughout the whole document.

Throughout the whole document, the terms "connected to" or "coupled to" are used to designate a connection or coupling of one element to another element and include both a case where an element is "directly connected or coupled to" another element and a case where an element is "electronically connected or coupled to" another element via still another element. Further, the term "comprises or includes" and/or "comprising or including" used in the document means that one or more other components, steps, operations, and/or the existence or addition of elements are not excluded in addition to the described components, steps, operations and/or elements.

Figure 1:
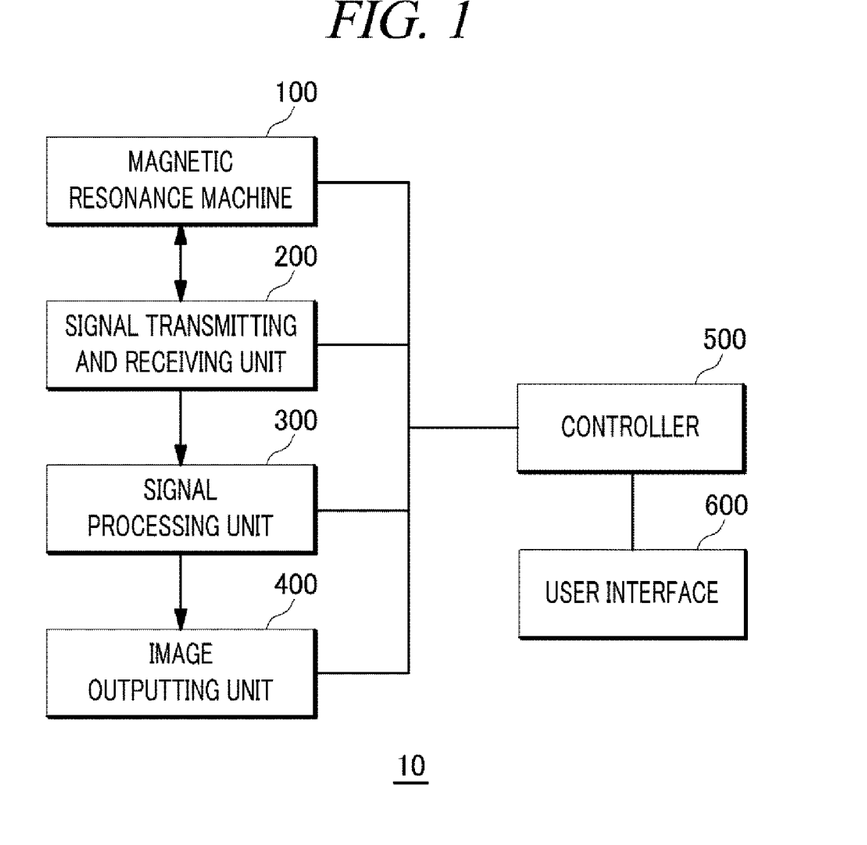
FIG. 1 shows a magnetic resonance imaging apparatus in accordance with an example embodiment.

FIG. 1 shows a magnetic resonance imaging apparatus in accordance with an example embodiment.

A magnetic resonance imaging apparatus 10 includes a magnetic resonance machine 100, a signal transmitting and receiving unit 200, a signal processing unit 300, an image outputting unit 400, a controller 500 and a user interface 600.

The magnetic resonance machine 100 may include a shield having a cylindrical structure to surround a target to be imaged, a main magnet provided in the inside of the shield, a gradient coil, an RF coil and others. The main magnet, the gradient coil, the RF coil and others generate a magnetic field for inducing a magnetic resonance signal from atomic nucleuses within a human body. The gradient coil generates a gradient magnetic field varying with a certain gradient in each of a multiple number of directions, e.g., x, y and z directions, in proportion to a distance from a reference position within a static magnetic field generated by the main magnet. Here, the reference position may be an origin of a three-dimensional coordinate system when the space where the static magnetic field generated by the main magnet exists is represented by the three-dimensional coordinate system. As a result of the gradient magnetic field generated by the gradient coil, each of magnetic resonance signals received through the RF coil has position information in the three-dimensional space. Meanwhile, the gradient coil may consist of an x gradient coil that generates a gradient magnetic field varying in an x direction, a y gradient coil that generates a gradient magnetic field varying in a y direction, and a z gradient coil that generates a gradient magnetic field varying in a z direction.

In order to transit the low energy state of the atomic nucleuses into the high energy state, the RF coil outputs electromagnetic wave signals having radio frequencies corresponding to types of the atomic nucleuses. In addition, the RF coil receives electromagnetic wave signals radiated from the atomic nucleuses within the target to be imaged, and the received electromagnetic wave signals are free induction decay (FID) signals or echo signals. In addition, length of a time zone from the time point that the electromagnetic wave signals are applied to the target to be imaged, i.e., the time point that the electromagnetic wave signals are generated, to the time point that the electromagnetic wave signals are received from the target to be imaged is echo time (TE). Length of a time zone where the application of the electromagnetic wave signals to the human body is repeated is repetition time (TR).

The signal transmitting and receiving unit 200 generates an AC signal having a frequency varying with a certain gradient in each of x, y and z directions according to a control signal input from the controller 500 to output the signal to the gradient coil. In addition, the signal transmitting and receiving unit 200 generates an AC signal having a pulse train according to a control signal input from the controller 500 to output the signal to the RF coil. In addition, the signal transmitting and receiving unit 200 receives the magnetic resonance signal received through the RF coil.

The received magnetic resonance signal is transmitted to the signal processing unit 300, and the signal processing unit 300 produces a magnetic resonance image by using the magnetic resonance signal. The signal processing unit 300 produces the magnetic resonance image based on information acquired through a spin echo signal and a gradient echo signal. The example embodiments suggest a compressed sensing technique capable of restoring a high resolution image having a complicated structural characteristic by applying a sparse space optimized for a characteristic of the image to separate and restore the image, while using the compressed sensing technique in the above-described signal processing process, and the technique is specifically described later.

The image outputting unit 400 outputs the magnetic resonance image produced by the signal processing unit 300 through a display or others.

The controller 500 controls the operation of the magnetic resonance machine 100, the signal transmitting and receiving unit 200, the signal processing unit 300, and the image outputting unit 400, according to instructions input from a user through the user interface 600. For example, the signal transmitting and receiving unit 200 is controlled to output the AC signal to the gradient coil and the RF coil, or the magnetic resonance signal received through the RF coil is controlled to be delivered to the signal processing unit 300 via the signal transmitting and receiving unit 200.

The user interface 600 receives input of the instructions from the user to transmit the instructions to the controller 500. In this case, the user interface 600 may be realized as a graphic user interface program and an input device like a keyboard, a mouse, or others, but is not limited thereto.

For reference, the components illustrated in FIG. 1 in accordance with an example embodiment may imply software or hardware such as a field programmable gate array (FPGA) or an application specific integrated circuit (ASIC), and carry out predetermined functions.

However, the "components" are not limited to the software or the hardware, and each of the components may be stored in an addressable storage medium or may be configured to implement one or more processors.

Accordingly, the components may include, for example, software, object-oriented software, classes, tasks, processes, functions, attributes, procedures, sub-routines, segments of program codes, drivers, firmware, micro codes, circuits, data, database, data structures, tables, arrays, variables and the like.

The components and functions thereof can be combined with each other or can be divided.

In an example embodiment, one image is divided into a mutually complementary part, i.e., a piecewise smooth part, and a residual part, and the compressed sensing algorithm is implemented in the manner that different sparse spaces are set for the parts.

$$f = f_p + f_r + \eta \quad \text{[Math Formula 1]}$$

That is, as in Match Formula 1, the piecewise smooth part ($f_p$, hereinafter referred-to as a "baseline image") is specified by a slowly varying baseline structure, and the residual part ($f_r$) is specified by a detailed image component in the complementary relation with the slowly varying baseline structure. In this case, $\eta$ means zero (0) mean Gaussian noise.

By using the fact that total variation (TV) regularization causes transform of a sharp boundary, and flattens a boundary of a rough or vibrating image, the piecewise smooth part is reconstructed through minimization of the total variation.

In addition, since a detailed image excluded from the baseline image is inherently reflected in the residual part, complementary boundary information is extracted from the residual part ($f_r$) by using wavelet-based sparse transform.

In this regard, the compressed sensing technique of the example embodiments acquires an MRI image, in the manner that the minimization problem defined in Math Formula 2 below is solved.

$$\underset{f_p, f_r}{\mathrm{argmin}} \left\{ \frac{1}{2} \| F_u(f_p + f_r) - d_u \|_2^2 - \lambda_{TV} \| f_p \|_{TV} + \lambda_1 \| \Psi f_r \|_1 \right\} \quad \text{[Math Formula 2]}$$

F means a Fourier descriptor, u means a pseudo random subset of Fourier encoding, d means measured k-space data, $\psi$ means a sparse descriptor, and each of $\lambda_1$ and $\lambda_{TV}$ means a regularization parameter. In addition, $\|f\|_{TV}$ is total variation, and can be calculated by the following math formula ($\|f\|_{TV} = \Sigma \sqrt{|\nabla_x f|^2 + |\nabla_y f|^2}$; $\nabla_x$ and $\nabla_y$ mean finite difference values in x and y directions, respectively).

The baseline image part ($f_p$) has sparsity in a total variation domain. The residual part ($f_r$) has no significant coefficient in an image domain and has sparsity in a wavelet domain. Accordingly, in an example embodiment, the compressed sensing technique is applied, by setting different sparse spaces depending on characteristics of components of an image.

That is, for example, a total variation sparse space or Harr transform is applied to the baseline image part ($f_p$), and for example, a wavelet domain, a curvelet domain, a ridgelet domain, a contourlet domain or a bandelet domain is applied to the residual part ($f_r$), so as to enable each of the baseline image part ($f_p$) and the residual part ($f_r$) to have sparsity. Furthermore, a repeatedly estimating process to maximize the sparsity in each of the different sparse spaces is implemented, such that the baseline image part ($f_p$) and the residual part ($f_r$) are reconstructed.

Meanwhile, in an example embodiment, an additional process related to the reconstruction of the residual part ($f_r$) may be implemented. For example, the compressed sensing technique may be implemented by using the point that there is statistical dependence when a sparse space having multi-directionality and multi-resolution like the wavelet space is used.

It is known that statistical dependence exists both between inter-scale sub-bands and between intra-scale sub-bands in the wavelet transform domain, and based on the dependence, a clustered form within one scale remains similar in another scale as well. That is, a position having a large value still has a large value at the corresponding position in a next scale, and a position having a small value has also the same characteristic.

On the premise of the above description, an example embodiment may use a local scale mixture (LSM) model based on a least square technique. Through the local scale mixture model, the statistical dependence and the non-stationary characteristic of the wavelet may be applied to the problem of Match Formula 2.

In an example embodiment, in order to reflect the characteristic that the statistical dependence of the wavelet spatially varies, a wavelet coefficient of each of the sub-bands is discriminated by Np partitions with respect to all the scales. Meanwhile, in case of a compressed sensing MRI, sampling is implemented with high density in a low frequency domain, and sampling is implemented with relatively low density in a high frequency domain.

Figure 2A:
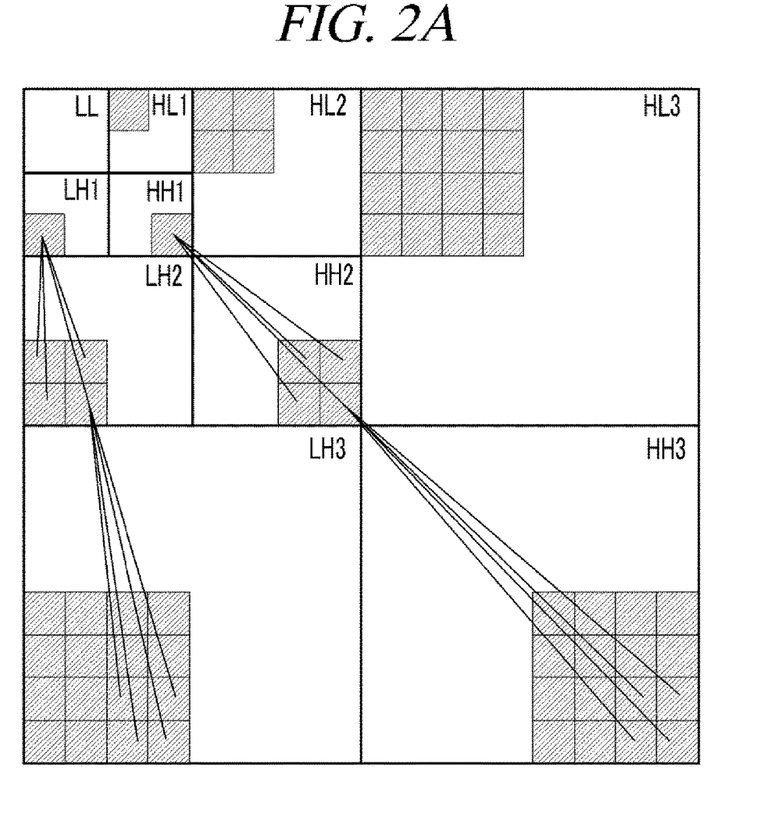
FIG. 2A and FIG. 2B show an LSM model used in the magnetic resonance imaging apparatus in accordance with an example embodiment.
Figure 2B:
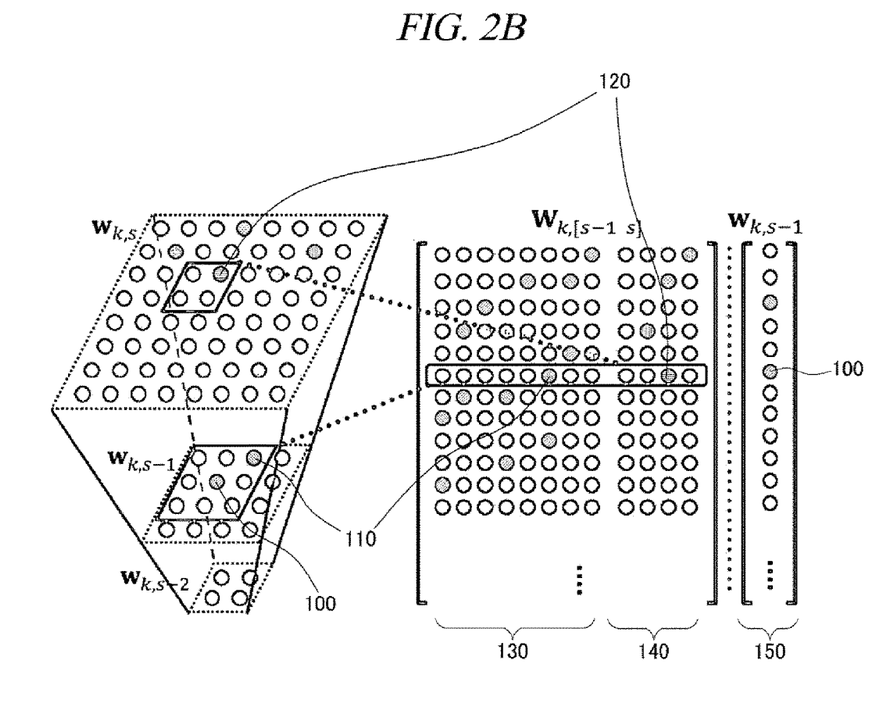

FIG. 2A and FIG. 2B show the LSM model used in the magnetic resonance imaging apparatus in accordance with an example embodiment.

FIG. 2A shows wavelet coefficients of a tree structure. That is, FIG. 2A illustrates sub-bands LH1, HH1, and HL1 corresponding to a first scale, sub-bands LH2, HH2, HL2 corresponding to a second scale, and sub-bands LH3, HH3 and HL3 corresponding to a third scale. From FIG. 2A, it can be confirmed that there is mutual dependence between a parent sub-band and a child sub-band or between a high scale and a low scale, which are positioned in the same direction connected with solid lines.

Meanwhile, in order to reflect the characteristic that the statistical dependence of the wavelet spatially varies, a wavelet coefficient of each of the sub-bands is discriminated by Np partitions with respect to all the scales. In this case, each of the partitions is shaded in each of the sub-bands of FIG. 2A.

FIG. 2B illustrates an example for an LSM model matrix. In this case, $W_{k,s}$ means a wavelet coefficient of a $k^{th}$ partition of a scale s. For example, if $W_{k, s-2}$ means a wavelet coefficient of a partition belonging to a first scale, $W_{k, s-1}$ means a wavelet coefficient of a partition belonging to a second scale, and $W_{k, s}$ means a wavelet coefficient of a partition belonging to a third scale. Meanwhile, the LSM matrix consists of a matrix 130 including peripheral data 110 belonging to the same partition or intra scale as target data 100 and a matrix 140 including peripheral data 120 belonging to a sub-band corresponding to the target data. Meanwhile, a matrix 150 including the target data may be displayed together. Accordingly, correlation between the target data and the peripheral data of the target data and correlation between the target data and the peripheral data belonging to the sub-band corresponding to the target data can be calculated. The residual part may be reconstructed based on highly related data depending to the correlation, and the reconstruction may be repeatedly implemented.

The matrix of the LSM model may be represented by Math Formula 3.

$$w_{k,s-1}^i = \sum_{i \in P_k} a_k^T w_{k,s-1}^i + \sum_{i \in P_k} b_k^T w_{k,s}^i \quad \text{[Math Formula 3]}$$

In this case, $w_{k,s-1}^i$ means an $i^{th}$ target wavelet coefficient in a $k^{th}$ partition of an s−1 scale, $w_{k,s-1}^i$ means a column vector of a neighbor wavelet coefficient positioned at a periphery of a target wavelet coefficient, and $w_{k,s}^i$ means a column vector of a wavelet coefficient positioned in a child sub-band and corresponding to a target wavelet coefficient of a parent sub-band.

Meanwhile, the wavelet coefficient of Math Formula 3 may be represented in the matrix form of Math Formula 4 below.

$$w_{k,s-1} = [W_{k,s-1} \; W_{k,s}]\begin{bmatrix} a_k \\ b_k \end{bmatrix} \quad \text{[Math Formula 4]}$$

$$W_{k,s-1} = [w_{k,s-1}^1 \; \ldots \; w_{k,s-1}^{N_v}]^T,$$

$$W_{k,s} = [w_{k,s}^1 \; \ldots \; w_{k,s}^{N_v}]^T$$

In this case, $w_{k,s-1}$ means the matrix 150 of all wavelet coefficients belonging to a $k^{th}$ partition of a scale s−1, $W_{k,s-1}$ means the matrix 130 of peripheral wavelet coefficients of a target belonging to a $k^{th}$ partition of a scale s−1, and $W_{k,s}$ means the matrix 140 of a wavelet coefficient positioned in a child sub-band and corresponding to a target wavelet coefficient of a parent sub-band. In this case, $N_v$ means the number of all the wavelet coefficients within each of the partitions.

On the premise that sample covariance of each of the partitions does not vary, and based on least square estimation using a wavelet coefficient of a pair of a parent band and a child band, dependence between the parent band and the child band of the wavelet coefficient can be calculated through Math Formula 5 below.

$$\hat{c}_k = \underset{c_k}{\operatorname{argmin}} \|w_{k,s-1} - W_{k,[s-1\;s]}c_k\|_2^2 + \zeta\|c_k\|_2^2 \quad \text{[Math Formula 5]}$$

$$\hat{c}_k = (W_{k,[s-1\;s]}^H W_{k,[s-1\;s]} + \zeta I)^{-1} W_{k,[s-1\;s]}^H w_{k,s-1}$$

In this case, I means an identity matrix, $\zeta$ means a regularization parameter, $W_{k,[s-1\;s]}$ means $[W_{k,s-1}\; W_{k,s}]$, and $c_k$ means $[a_k\; b_k]^T$.

As described above, the LSM model indicates dependence of the wavelet coefficient between the parent band and the child band, and implements the reconstruction of the residual part by using the LSM model. Meanwhile, in addition to the wavelet transform, the curvelet transform or others may be used as the sparse space for the residual part, and in this case, the reconstruction of the residual part may be also implemented by using the LSM model.

Hereinafter, a method for reconstructing the residual part by using the LSM model is described.

By solving the convex optimization problem defined in Math Formula 6 below, residuals of high frequency wavelet sub-bands having the same orientation can be estimated.

$$\min_{w_{s-1}, w_s} \|w_{s-1}\|_1 + \|w_s\|_1 \quad \text{[Math Formula 6]}$$

s.t.

$$u_{s-1} = F_u w_{s-1}$$

$$u_s = F_u w_s$$

$$(I - A)w_{s-1} = B w_s$$

In this case, $W_s$ and $W_{s-1}$ mean wavelet coefficients of the child band and the parent band, respectively, $U_{s-1}$ and $U_s$ mean data reliability, and A and B mean block diagonal sparse matrixes indicating $a_k$ and parameters of the LSM model, respectively.

The optimization problem of Math Formula 6 may be reestablished in the form of the sparsity regularization problem of Math Formula 7 below.

$$\underset{w_{s-1}, w_s}{\operatorname{argmin}} \frac{1}{2} \left\| \begin{bmatrix} u_{s-1} \\ u_s \\ 0 \end{bmatrix} - \begin{bmatrix} F_u & 0 \\ 0 & F_u \\ \lambda_{LSM}(I-A) & \lambda_{LSM}B \end{bmatrix} \begin{bmatrix} w_{s-1} \\ w_s \end{bmatrix} \right\|_2^2 + \quad \text{[Math Formula 7]}$$

$$\left\| \begin{bmatrix} \lambda_{s-1} w_{s-1} \\ \lambda_s w_s \end{bmatrix} \right\|_1$$

In this case, $\lambda_{LSM}$, $\lambda_s$ and $\lambda_{s-1}$ mean data reliability, wavelet directionality dependence and a regularization parameter for balance of wavelet sub-band sparsity.

Meanwhile, Math Formula 7 may be described in the form of Math Formulas 8 and 9 below.

$$g(W) = \underset{w}{\operatorname{argmin}} \frac{1}{2}\|U - QW\|_2^2 + \Lambda\|W\|_1 \quad \text{[Math Formula 8]}$$

$$U = \begin{bmatrix} u_{s-1} \\ u_s \\ 0 \end{bmatrix} \; Q = \begin{bmatrix} F_u & 0 \\ 0 & F_u \\ \lambda_{LSM}(I-A) & \lambda_{LSM}B \end{bmatrix} \quad \text{[Math Formula 9]}$$

$$W = \begin{bmatrix} w_{s-1} \\ w_s \end{bmatrix} \Lambda = \begin{bmatrix} \lambda_{s-1} \\ \lambda_s \end{bmatrix}$$

A pair $(W_{s-1}, W_s)$ of wavelet sub-bands having the same orientation may be estimated in parallel by a conventionally known forward-backward (FB) separation algorithm. For example, a forward gradient descent method may be used for the first term ($\frac{1}{2}\|U-QW\|_2^2$) of Math Formula 8, and a backward wavelet shrinkage method may be used for the second term ($\|W\|_1$) of Math Formula 8.

Figure 3:
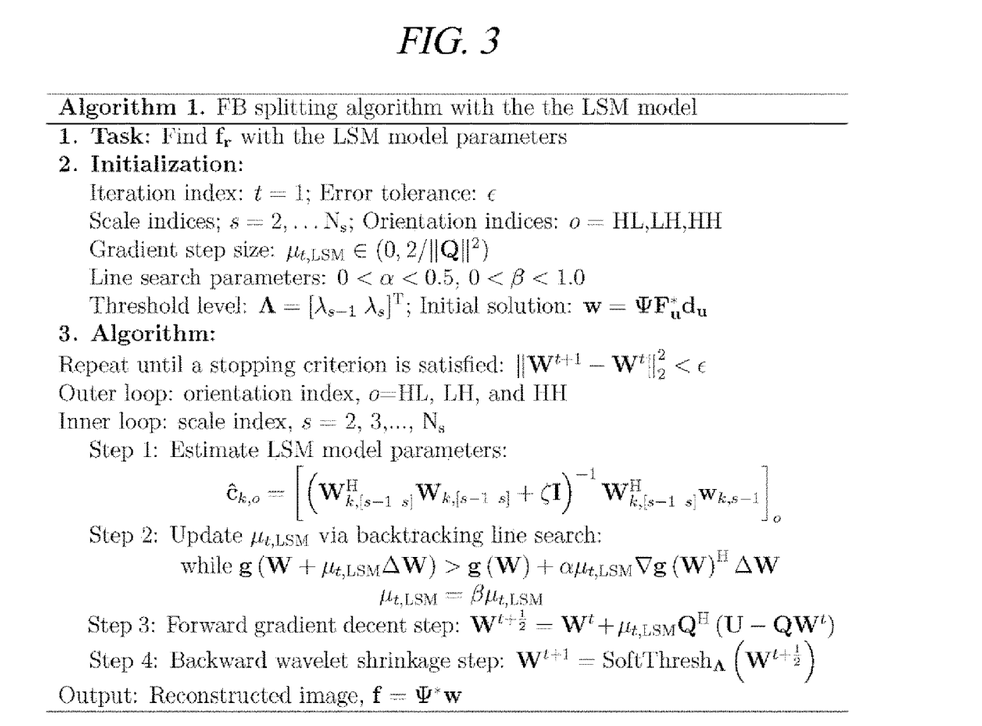
FIG. 3 shows a forward backward separation algorithm for the LSM model in accordance with an example embodiment.

The forward backward separation algorithm for the LSM model is described by using FIG. 3.

FIG. 3 shows the forward backward separation algorithm for the LSM model in accordance with an example embodiment.

In a first step, a LSM parameter is estimated based on the formula defined in Math Formula 5.

In a second step, a size of a gradient descent step in forward gradient descent to be implemented in a third step is adaptively determined. In this case, a conventionally known backtracking line search algorithm may be used.

In the third step, the forward gradient descent step is implemented according to Math Formula 10.

$$W^{t+1/2} = W^t + \mu_{t,LSM} Q^H (U - QW^t) \quad \text{[Math Formula 10]}$$

In a fourth step, the backward wavelet shrinkage step is implemented according to Math Formulas 11 and 12.

$$W^{t+1} = SoftThresh_{\mu_{t,LSM}, \Lambda}(W^{t+\frac{1}{2}}) \quad \text{[Math Formula 11]}$$

$$= \left(\left|W^{t+\frac{1}{2}}\right| - \Lambda\right)_+ \exp\left(i \arg\left(W^{t+\frac{1}{2}}\right)\right)$$

$$\left(\left|W^{t+\frac{1}{2}}\right| - \Lambda\right)_+ = \begin{cases} \left|W^{t+\frac{1}{2}}\right| - \Lambda, & \left|W^{t+\frac{1}{2}}\right| > \Lambda \\ 0, & \left|W^{t+\frac{1}{2}}\right| \leq \Lambda \end{cases} \quad \text{[Math Formula 12]}$$

By repeatedly implementing these steps, the wavelet coefficients are estimated until difference in the consecutive wavelet coefficients becomes smaller than a threshold value.

Next, a process for reconstructing an image by using the residual part reconstructed by using the baseline image part and the estimated LSM parameter is described.

Math Formula 13 below may be established by combining Math Formula 2 to be used to reconstruct the baseline image part ($f_p$) and the residual part ($f_r$) and Math Formula 6 showing the LSM model for estimation of the residual part with each other.

$$h(f_p, f_r) = \frac{1}{2}\|F_u(f_p + f_r) - d_u\|_2^2 + \lambda_{TV}\|f_p\|_{TV} + \quad \text{[Math Formula 13]}$$

$$\sum_{o=1}^{N_o}\sum_{s=1}^{N_s}\left\{\lambda_{LSM}^{o,s}\left(\frac{1}{2}\|((I-A)\Psi_{s-1} + B\Psi_s)f_r\|_2^2\right)_o - \right.$$

$$\left. \lambda_1^{o,s}(\|\Psi_s f_r\|_1 + \|\Psi_{s-1} f_r\|_1)_o\right\}$$

$N_o$ means the number of all orientations [e.g., for a two-dimensional image, $N_o$=3(NHL, LH, HH)], $\Psi_s$ means a wavelet transform descriptor for extracting a wavelet coefficient of a sub-band of a scale s, and $(\cdot)_o$ means a descriptor for extracting a sub-band in a corresponding orientation.

In order to solve the problem of Math Formula 13, $f_p$ and $f_r$ are discriminated from each other such that two (2) formulas are solved.

First, the residual part ($f_r$) is fixed, and the baseline image part ($f_p$) for minimizing Math Formula 13 is calculated. That is, the baseline image part is calculated based on Math Formula 14 below. In this case, there is the relation of $d_p = d_u - F_u f_r^t$.

$$f_p^{t+1} = \underset{f_p}{\arg\min}\, h(f_p, f_r^t) \quad \text{[Math Formula 14]}$$

$$= \underset{f_p}{\arg\min}\frac{1}{2}\|F_u f_p - d_p\|_2^2 + \lambda_{TV}\|f_p\|_{TV}$$

Meanwhile, Math Formula 14 may be solved according to a nonlinear conjugate gradient method or a steepest gradient descent method. For example, in case of the steepest gradient descent method, the baseline image part ($f_p$) may be estimated by using Math Formula 15 below for each of the repeated steps.

$$f_p^{t+1} = f_p^t - \mu_{t,TV}(F_u^H(F_u f_p - d_p) + \lambda_{TV}\nabla\|f_p\|_{TV}) \quad \text{[Math Formula 15]}$$

Next, the baseline image part ($f_p$) is fixed, and the residual part ($f_r$) for minimizing Math Formula 13 is calculated. That is, the residual part is calculated based on Math Formula 16 below. In this case, there is the relation of $d_r = d_u - F_u f_p^{t+1}$.

$$f_r^{t+1} = \underset{f_r}{\arg\min}\, h(f_p^{t+1}, f_r) \quad \text{[Math Formula 16]}$$

$$= \underset{f_r}{\arg\min}\frac{1}{2}\|F_u f_r - d_r\|_2^2 +$$

$$\sum_{o=1}^{N_o}\sum_{s=1}^{N_s}\left\{\lambda_1^{o,s}(\|\Psi_s f_r\|_1 - \|\Psi_{s-1} f_r\|_1)_o + \right.$$

$$\left. \lambda_{LSM}^{o,s}\left(\frac{1}{2}\|((I-A)\Psi_{s-1} + B\Psi_s)f_r\|_2^2\right)_o\right\}$$

Meanwhile, if Math Formula 16 is applied to a pair of sub-bands having the same dependence in the condition of a scale s and orientation o, $\Psi_{s-1}f_r$ and $\Psi_s f_r$ are replaced with $w_{s-1}$ and $w_s$, respectively, and the first term ($\|F_u f_r - d_r\|_2^2$) is reduced to $\|F_u[w_s\ w_{s-1}]^T - [u_s\ u_{s-1}]^T\|_2^2$.

Accordingly, the forward backward separation algorithm for the LSM model becomes the same as the adaptive residual reconstruction based on the LSM model of Math Formula 7, and thus, may be reduced in the form of Math Formula 17 below.

$$W^{t+1} = \underset{w}{\arg\min}(f_p^{t+1}, W) \quad \text{[Math Formula 17]}$$

$$= \underset{w}{\arg\min}\frac{1}{2}\|U - QW\|_2^2 + \Lambda\|W\|_1$$

$$= SoftThresh_{\mu_{t,LSM}, \Lambda}(W^t + \mu_{t,LSM}Q^H(U - QW^t))$$

Figure 4:
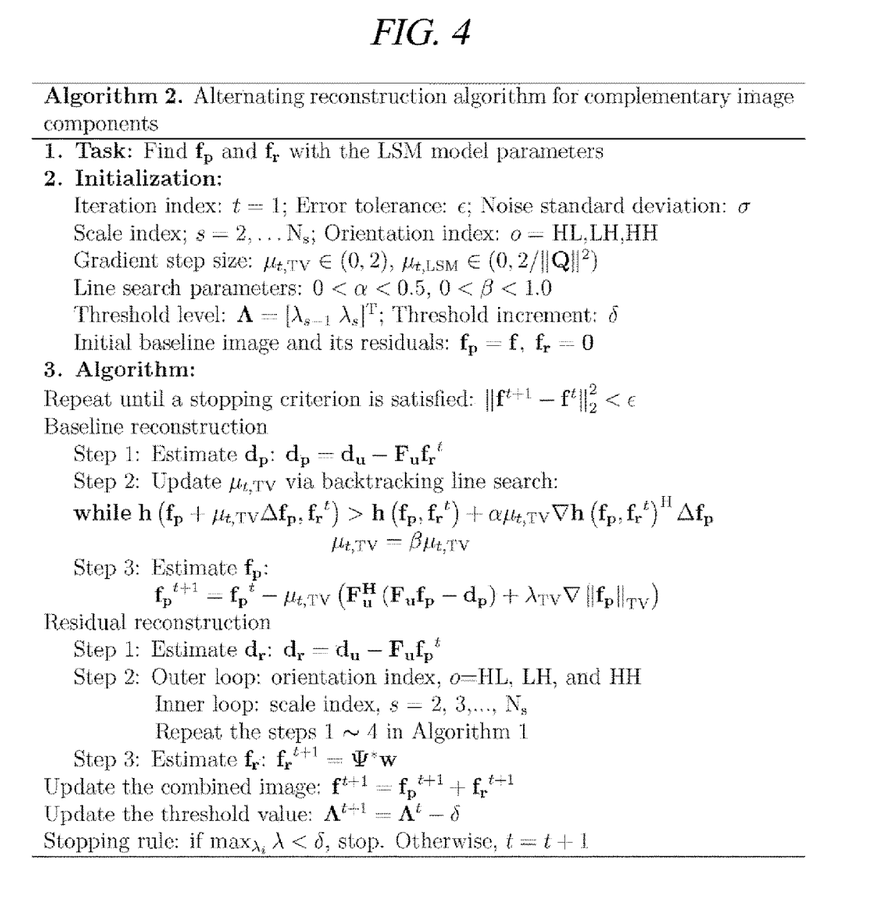
FIG. 4 shows an image reconstruction algorithm in accordance with an example embodiment.

The process for reconstructing an image by using the baseline image part and the estimated residual part is described by using FIG. 4.

FIG. 4 shows an image reconstruction algorithm in accordance with an example embodiment.

As illustrated in FIG. 4, an algorithm for reconstructing the baseline image part and an algorithm for reconstructing the residual part are independently implemented.

In case of the algorithm for reconstructing the baseline image part, the baseline image part is estimated by using, for example, Math Formula 15 described above, and repeatedly reconstructed until difference in the temporally consecutive estimated baseline image parts becomes a threshold value or less.

Likewise, in case of the algorithm for reconstructing the residual part, a wavelet coefficient is calculated through the algorithm illustrated in FIG. 3, and on this basis, the residual part is reconstructed.

The baseline image part and the residual part that have been reconstructed through the above-described steps are combined with each other, and the above-described steps are repeatedly implemented until difference in the temporally consecutive reconstructed images becomes smaller than a threshold value.

Figure 5:
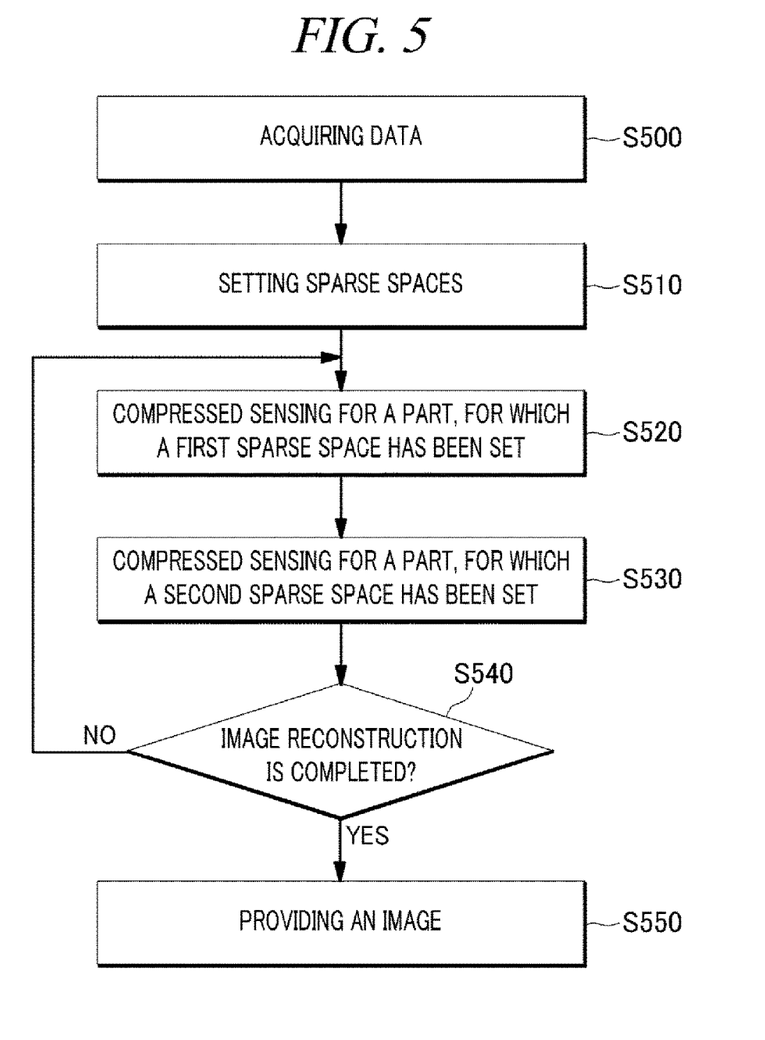
FIG. 5 shows a method for producing a magnetic resonance image by using the magnetic resonance imaging apparatus in accordance with an example embodiment.

FIG. 5 is a flow chart showing a method for producing a magnetic resonance image by using the magnetic resonance imaging apparatus in accordance with an example embodiment.

First, data are acquired through the receiving coil of the magnetic resonance imaging apparatus (S500).

For example, data may be acquired by using variable random under sampling whereby data are acquired with high density in a low frequency domain of a k-space in a Cartesian lattice, and data are acquired with low density in a peripheral part of the k-space, i.e., a high frequency domain. In addition, data may be acquired in a radial or spiral form by using only frequency encoding.

Next, characteristics of an image are identified based on the acquired data, and a multiple number of sparse spaces are set (S510). In this case, a multiple number of sparse spaces are set for unit data of a single image. For example, a sparse space, to which a total variation limiting condition is applied, may be set for the piecewise smooth part, and a wavelet sparse space may be set for the other residual parts.

Next, the compressed sensing algorithm is applied for each image according to the sparse spaces that have been set. That is, the compressed sensing algorithm is applied to a part, for which a first sparse space has been set (S120), and the compressed sensing algorithm is applied to a part, for which a second sparse space has been set (S130).

For example, with respect to the piecewise smooth part, an image is reconstructed in the manner that the problem of Math Formula 14 is solved in consideration of the total variation limiting condition. Next, with respect to the residual part, the compressed sensing algorithm is applied in the form of applying the wavelet sparse space. Meanwhile, three (3) or more sparse spaces may be set for one image, and the compressed sensing algorithm may be applied to each of the spaces in accordance with an example embodiment.

In this case, based on the point that when the wavelet sparse space is applied, there is statistical dependence depending on directionality or scale (resolution), a more exact compressed sensing algorithm may be applied by using the LSM model. That is, the sparse spaces are set by further considering the mutual dependence of sub-bands having the same directionality or the same scale through the LSM model described in FIG. 2 and FIG. 3, and on this basis, the compressed sensing algorithm is applied.

As described above, the step for reconstructing an image by setting different sparse spaces for one space is implemented, and this step may be repeated a multiple number of times (S540). That is, each of the steps (S520, 5530) is repeated until difference between the sequentially produced two (2) reconstructed images becomes smaller than a threshold value. That is, the algorithm is finished when difference between a first combined image and a second combined image sequentially produced after the first combined image is smaller than a threshold value, and the image reconstruction is repeated when the difference is larger than the threshold value.

Next, when the image reconstruction is completed, the images of the respective parts are combined with each other to be provided (S550). That is, the parts that have been reconstructed are transformed to a k space, and then, combined with each other to generate one k space.

Example embodiments can be embodied in a storage medium including instruction codes executable by a computer or processor such as a program module executed by the computer or processor. A computer readable medium can be any usable medium which can be accessed by the computer and includes all volatile/nonvolatile and removable/non-removable media. Further, the computer readable medium may include all computer storage and communication media. The computer storage medium includes all volatile/nonvolatile and removable/non-removable media embodied by a certain method or technology for storing information such as computer readable instruction code, a data structure, a program module or other data. The communication medium typically includes the computer readable instruction code, the data structure, the program module, or other data of a modulated data signal such as a carrier wave, or other transmission mechanism, and includes information transmission mediums.

The method and the system of the example embodiments have been described in relation to the certain examples. However, the components or parts or all the operations of the method and the system may be embodied using a computer system having universally used hardware architecture.

The above description of the example embodiments is provided for the purpose of illustration, and it would be understood by those skilled in the art that various changes and modifications may be made without changing technical conception and essential features of the example embodiments. Thus, it is clear that the above-described example embodiments are illustrative in all aspects and do not limit the present disclosure. For example, each component described to be of a single type can be implemented in a distributed manner. Likewise, components described to be distributed can be implemented in a combined manner.

The scope of the inventive concept is defined by the following claims and their equivalents rather than by the detailed description of the example embodiments. It shall be understood that all modifications and embodiments conceived from the meaning and scope of the claims and their equivalents are included in the scope of the inventive concept.

We claim:

1. A method for processing a magnetic resonance image, comprising:
   receiving data through a receiving coil;
   setting a plurality of sparse spaces for unit data of a single image;
   reconstructing an image by data, for which the sparse spaces have been set; and
   combining the reconstructed images with each other to provide the combined image.

2. The method for processing a magnetic resonance image of claim 1,
   wherein the setting of the plurality of the sparse spaces comprises:
   setting a first sparse space for part of the unit data; and
   setting a second sparse space for the other data, and
   the reconstructing of an image by data, for which the sparse spaces have been set, comprises:
   reconstructing a baseline image based on the data, for which the first sparse space has been set; and
   reconstructing a residual image based on the data, for which the second sparse space has been set.

3. The method for processing a magnetic resonance image of claim 2,
   wherein the first sparse space is a total variation domain or Harr transform, and the second sparce space is a wavelet domain, a curvelet domain, a ridgelet domain, a contourlet domain or a bandelet domain.

4. The method for processing a magnetic resonance image of claim 2,
   wherein the combining of the reconstructed images to provide the combined image comprises:
   producing a combined image by combining the baseline image and the residual image with each other; and
   comparing difference between a first combined image and a second combined image sequentially produced after the first combined image, and determining whether to implement the reconstructing of the image depending on the comparison result.

5. The method for processing a magnetic resonance image of claim 2, wherein the reconstructing of the baseline image comprises restoring an image according to a compressed sensing method that applies a total variation limiting condition for the data, for which the first sparse space has been set.

6. The method for processing a magnetic resonance image of claim 2, wherein the reconstructing of the residual image comprises:

generating a local scale mixture matrix based on a wavelet coefficient provided according to the setting of the second sparse space;

calculating correlation between target data and peripheral data of the target data and correlation between the target data and peripheral data belonging to an upper or lower scale corresponding to the target data, based on the local scale mixture matrix;

calculating a wavelet coefficient to maximize the correlation; and reconstructing the residual image based on the calculated wavelet coefficient, and the local scale mixture matrix comprises a matrix consisting of peripheral data of the same layer as the target data and a matrix consisting of peripheral data belonging to a lower or upper scale of the target data.

7. The method for processing a magnetic resonance image of claim 2, wherein in the reconstructing of the residual image, the residual image is reconstructed to maximize correlation between a target wavelet coefficient and a peripheral wavelet coefficient included in a sub-band, to which the target wavelet coefficient belongs, and correlation between the target wavelet coefficient and a peripheral wavelet coefficient included in a sub-band of an upper or lower scale of a sub-band, to which the target wavelet coefficient belongs, based on a wavelet coefficient provided according to the setting of the second sparse space.

8. An apparatus for processing a magnetic resonance image, comprising:

a magnetic resonance machine that comprises a main magnet, a gradient coil and an RF coil, and is formed to surround a target to be imaged;

a signal transmitting and receiving unit that transmits an electric signal to the magnetic resonance machine, and receives a magnetic resonance signal from the magnetic resonance machine; and a signal processing unit that produces a magnetic resonance image based on the magnetic resonance signal received from the signal transmitting and receiving unit, wherein the signal processing unit sets a plurality of sparse spaces for unit data of a single image, reconstructs an image by the data, for which the sparse spaces have been set, and then, combines the reconstructed images to provide a magnetic resonance image.

9. The apparatus for processing a magnetic resonance image of claim 8, wherein the signal processing unit sets a first sparse space for part of the unit data, and a second sparse space for the other data, and reconstructs a baseline image based on the data, for which the first sparse space has been set, and a residual image based on the data, for which the second sparse space has been set.

10. The apparatus for processing a magnetic resonance image of claim 9, wherein the signal processing unit restores an image according to a compressed sensing method that applies a total variation limiting condition for the data, for which the first sparse space has been set.

11. The apparatus for processing a magnetic resonance image of claim 9, wherein the signal processing unit generates a local scale mixture matrix based on a wavelet coefficient provided according to the setting of the second sparse space, calculates correlation between target data and peripheral data of the target data and correlation between the target data and peripheral data belonging to a lower or upper scale of the target data, based on the local scale mixture matrix;

calculates a wavelet coefficient to maximize the correlation; and reconstructs the residual image based on the calculated wavelet coefficient, and the local scale mixture matrix comprises a matrix consisting of peripheral data of the same layer as the target data and a matrix consisting of peripheral data belonging to a lower or upper scale of the target data.

12. The apparatus for processing a magnetic resonance image of claim 9, wherein the signal processing unit reconstructs the residual image to maximize correlation between a target wavelet coefficient and a peripheral wavelet coefficient included in a sub-band, to which the target wavelet coefficient belongs, and correlation between the target wavelet coefficient and a peripheral wavelet coefficient included in a sub-band of an upper or lower scale of a sub-band, to which the target wavelet coefficient belongs, based on a wavelet coefficient provided according to the setting of the second sparse space.

* * * * *

UNITED STATES PATENT AND TRADEMARK OFFICE
CERTIFICATE OF CORRECTION

PATENT NO. : 9,804,244 B2
APPLICATION NO. : 14/612759
DATED : October 31, 2017
INVENTOR(S) : Jaeseok Park et al.

It is certified that error appears in the above-identified patent and that said Letters Patent is hereby corrected as shown below:

In the Specification

Column 8, Line 14, replace "and parameters" with -- and $b_k$ parameters --.

Signed and Sealed this
Twenty-fourth Day of April, 2018

Andrei Iancu
*Director of the United States Patent and Trademark Office*